United States Patent
Toma (10) Patent No.: US 7,199,351 B2
(45) Date of Patent: Apr. 3, 2007

(54) SOLID STATE IMAGE SENSING APPARATUS WITH OUTPUT LEVEL CONTROLLER

(75) Inventor: Tetsuo Toma, Miyagi (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 293 days.

(21) Appl. No.: 10/460,166

(22) Filed: Jun. 13, 2003

(65) Prior Publication Data

US 2003/0234409 A1    Dec. 25, 2003

(30) Foreign Application Priority Data

Jun. 21, 2002  (JP) .............................. 2002-180853

(51) Int. Cl.
*H01L 31/00* (2006.01)
*H04N 5/235* (2006.01)

(52) U.S. Cl. .............................. 250/214.1; 250/214 C; 348/229.1; 348/314

(58) Field of Classification Search ............ 250/214.1, 250/208.1, 214 R, 214 A, 214 AG, 214 C; 348/229.1, 302, 300, 311, 314
See application file for complete search history.

(56) References Cited

U.S. PATENT DOCUMENTS

| | | | | |
|---|---|---|---|---|
| 4,963,980 A | * | 10/1990 | Suga et al. ............... | 348/220.1 |
| 5,528,291 A | * | 6/1996 | Oda ......................... | 348/220.1 |
| 5,786,852 A | * | 7/1998 | Suzuki et al. ............... | 348/312 |
| 6,452,153 B1 | * | 9/2002 | Lauxtermann et al. ... | 250/208.1 |
| 2001/0038064 A1 | * | 11/2001 | Mori et al. ............... | 250/208.1 |

FOREIGN PATENT DOCUMENTS

JP    2001-237409    8/2001

\* cited by examiner

*Primary Examiner*—Thanh X. Luu
*Assistant Examiner*—Stephen Yam
(74) *Attorney, Agent, or Firm*—Arent Fox PLLC (57) ABSTRACT

A solid state image sensing apparatus having: an image pickup device including; a semiconductor substrate of a first conductivity type, a well of a second conductivity type formed in the semiconductor substrate, charge accumulation regions of the first conductivity type formed in the well, and an overflow drain terminal electrically connected to the semiconductor substrate for controlling a potential barrier formed by the well; an amplifier for amplifying an output from the image pickup device; a sensitivity setter for setting a photographic sensitivity; and an output level controller for changing a saturation amount of charge accumulated in the charge accumulation region by changing the bias voltage applied to the overflow drain terminal in accordance with a set sensitivity.

15 Claims, 10 Drawing Sheets

SOLID STATE IMAGE SENSING APPARATUS WITH OUTPUT LEVEL CONTROLLER

CROSS REFERENCE TO RELATED APPLICATION

This application is based on and claims priority of Japanese Patent Application No. 2002-180853 filed on Jun. 21, 2002, the entire contents of which are incorporated herein by reference.

BACKGROUND OF THE INVENTION

A) Field of the Invention

The present invention relates to a solid state image sensing apparatus and more particularly to a solid state image sensing apparatus with an exposure sensitivity adjusting function.

B) Description of the Related Art

CCD and MOS solid state image pickup devices are prevailing which are used as solid state image pickup devices for digital cameras. Photodetectors of both the CCD and MOS solid state image pickup devices are made of photodiodes. In a general solid state image pickup device, a light shielding film with registered openings is disposed above photodiodes, color filters are disposed above the light shielding film, and on-chip micro lenses are disposed above the color filters in register with the respective photodiodes.

In a CCD solid state image pickup device, a charge coupled device (CCD) is disposed near a photodiode column to transfer charges accumulated in photodiodes of that column. In an area sensor, photodiodes are disposed in a matrix shape and each photodiode column is coupled to a vertical CCD (VCCD). One ends of a plurality of VCCDs are coupled to a horizontal CCD (HCCD) to transfer image charges of each row to an output amplifier.

In a MOS solid state image pickup device, a MOS charge detector is connected to each photodiode and supplies a voltage or current output signal corresponding to a light reception amount to an output signal line at each column.

It is necessary to increase the number of pixels in order to improve the resolution of a solid state image pickup device. As the number of pixels is increased by making each photodiode finer, the area occupied by each photodiode reduces so that the photographic speed or sensitivity lowers. In order to maintain or increase an output level, it is necessary to raise the sensitivity of an output amplifier of a CCD solid state image pickup device or a charge detector of a MOS solid state image pickup device. An output level of a solid state image pickup device can be improved, for example, by reducing the capacitance C of a capacitor (floating diffusion capacitor) for converting charges into voltage.

CCD solid state image pickup devices have been developed which have, for example, an output level (saturated output) of 3000 mV and a detection sensitivity of 48 µV/e. An output of a solid state image pickup device is supplied to a signal processor circuit formed in another chip whereat the output is subjected to correlated double sampling, analog amplification, analog/digital (A/D) conversion and the like. An input dynamic range of the signal processor circuit is at most about 1 V.

A solid state image sensing apparatus having a sensitivity setting function can set a photographic speed or sensitivity such as ISO100, ISO400, ISO800 and ISO1600. The gain of a signal processor circuit is adjusted in accordance with the photographic sensitivity. As the signal level becomes high, the noise level also becomes high. In order to form a good image, a wide dynamic range and a low noise level are desired.

In a solid state image sensing apparatus having a solid state image pickup device and a signal processor circuit, both the solid state image pickup device and the signal processor circuit are provided with an amplification function.

SUMMARY OF THE INVENTION

An object of this invention is to provide a solid state image sensing apparatus having well-balanced constituent elements.

Another object of the invention is to provide a solid state image sensing apparatus capable of suppressing the generation of vertical lines even under high illuminance.

According to one aspect of the present invention, there is provided a solid state image sensing apparatus comprising: a solid state image pickup device comprising: a semiconductor substrate of a first conductivity type; a well formed in the semiconductor substrate, the well having a second conductivity type opposite to the first conductivity type; a number of charge accumulation regions formed in the well, the charge accumulation region having the first conductivity type and a photodiode being constituted of the charge accumulation region and the well; and an overflow drain terminal electrically connected to the semiconductor substrate and used for controlling a potential barrier to be formed by the well by applying a bias voltage to the semiconductor substrate; an amplifier for amplifying an output from the solid state image pickup device; a sensitivity setter for setting a photographic sensitivity; and an output level controller for changing an amount of charges capable of being accumulated in the charge accumulation region by changing the bias voltage to be applied to the overflow drain terminal in accordance with a set sensitivity.

According to another aspect of the present invention, the solid state image sensing device is constituted of a CCD solid state image pickup device.

A solid state image sensing apparatus having a high performance solid state image pickup device and amplifier can realize a well-balanced image sensing performance.

The generation of vertical lines can be suppressed even for an object under high illuminance.

DESCRIPTION OF THE PREFERRED EMBODIMENTS

Prior to describing the embodiments of the invention, preliminary experiments and their results will be described upon which the invention is based.

Vertical line noises are sometimes formed on an image taken with a CCD solid state image sensing apparatus. Such noises are likely to be generated in a high brightness image.

Figure 1:
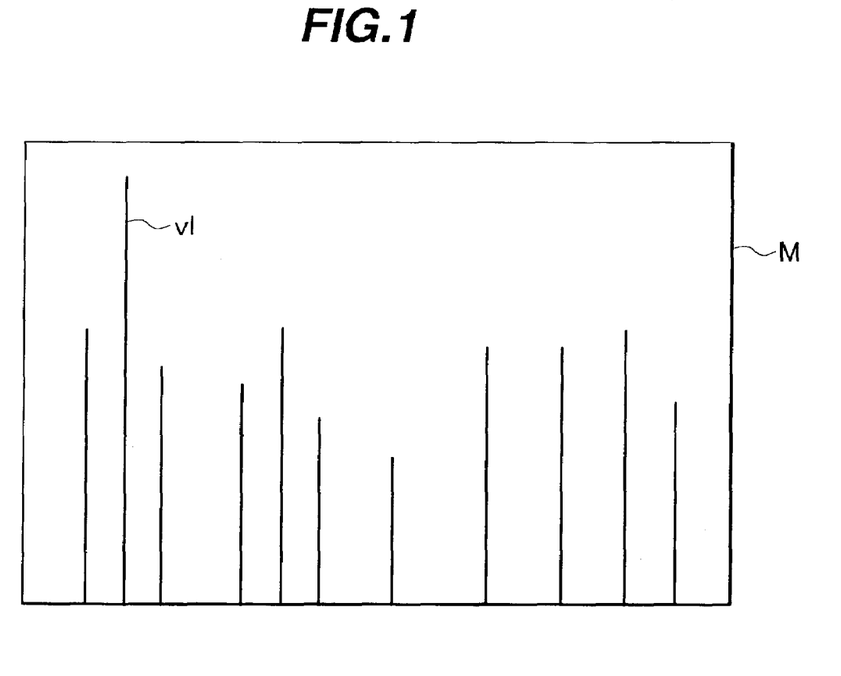
FIG. 1 is a sketch of high illuminance vertical lines on the monitor screen of a digital camera.

FIG. 1 is a sketch of a monitor screen of a CCD digital camera. The monitor screen was sketched by photographing a high illuminance object of solid red. It can be considered that all charge accumulation regions of red pixels accumulate charges up to a saturated amount. Vertical line noises vl appear on a monitor screen. Since such vertical lines are likely to be formed under high illuminance, this phenomenon will be called high illuminance vertical lines vl. The high illuminance vertical lines vl extend from middle heights of the screen to the bottom.

If VCCD has some defect and charges transferred in VCCD are made residual at the defect, the residual transfer charges affect the image signal upstream of the defect (the signal at the lower position in the screen). It can be estimated therefore that such noises are related to some defect of VCCD.

Figure 2:
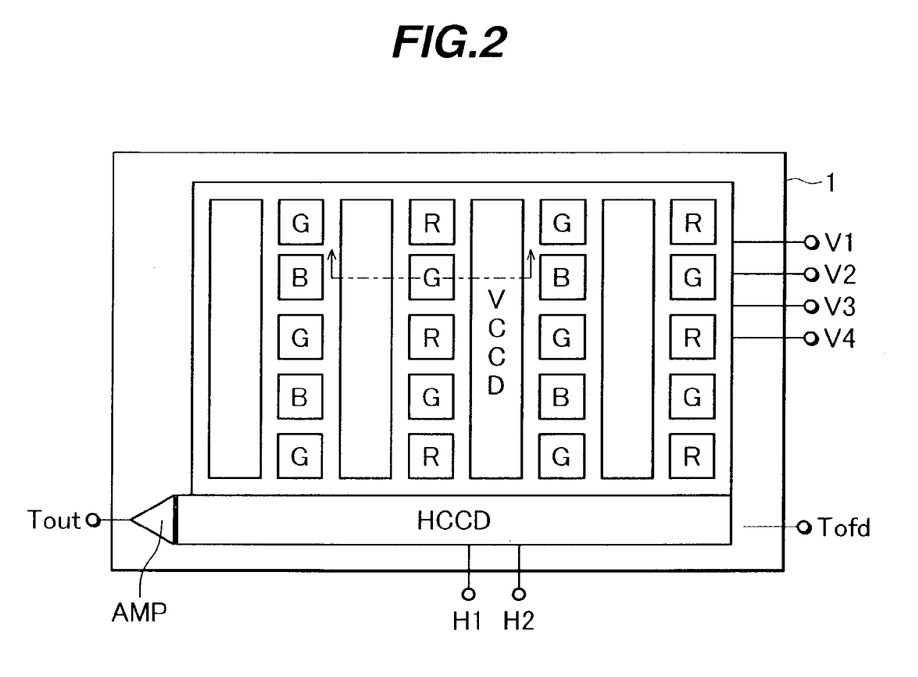
FIG. 2 is a schematic plan view showing the layout of a tetragonal configuration CCD solid state image pickup device.

FIG. 2 is a schematic plan view showing the structure of a tetragonal configuration solid state image pickup device. A number of pixels including green pixels G, red pixels R and blue pixels B are disposed in a tetragonal matrix shape in the light receiving area of a solid state image pickup device 1. The tetragonal matrix means the pixel layout that columns of pixels vertically aligned at a constant pitch are disposed at a constant pitch along the row direction. Although the simplified matrix is drawn, the actual matrix has several hundred rows and several hundred to one thousand and several hundred columns. The pixel layout shown in FIG. 2 is the Bayer layout whose pixel column is constituted of alternatively disposed green and blue pixels G and B or green and red pixels G and R.

A vertical charge coupled device VCCD is disposed along each pixel column. Image charges accumulated in each pixel can be read to VCCD. VCCD is driven by four-phase drive signals V1, V2, V3 and V4 to transfer image charges downward. The charges of each row transferred in VCCDs are supplied to a horizontal charge coupled device HCCD. HCCD is driven by two-phase drive signals H1 and H2 to transfer image charges of one row to the left.

Charges transferred through HCCD are converted each into a voltage signal by the floating diffusion region of an output amplifier AMP and amplified. The amplified image signal is supplied to the external from a chip output terminal Tout. The solid state image pickup device 1 is provided with an overflow drain voltage control terminal Tofd to allow a substrate (overflow drain) bias being adjusted.

Figure 3A:
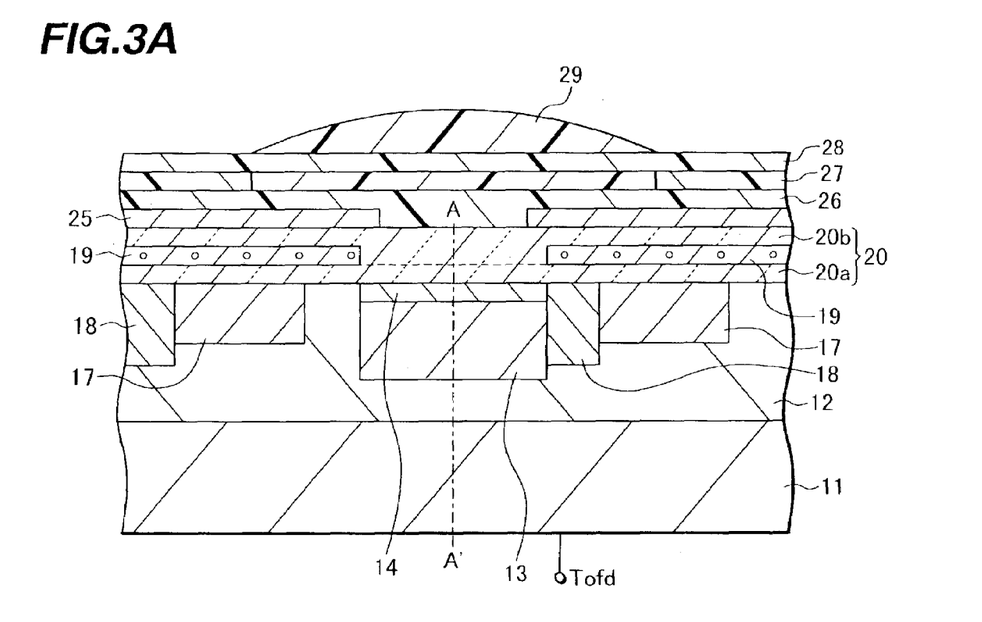
FIGS. 3A, 3B and 3C are cross sectional views of the solid state image pickup device shown in FIG. 2 and an estimated potential diagram of a VCCD.

FIG. 3A is a cross sectional view of a pixel along the thickness direction of the solid state image pickup device shown in FIG. 2. A p-type well 12 is formed by ion implantation or the like in a semiconductor substrate 11 made of n-type silicon. An n-type region 13 is formed by ion implantation or the like in the p-type well 12, the n-type region 13 constituting a charge accumulation region of a photodiode.

In the surface layer of the n-type charge accumulation region 13, a high impurity concentration $p^+$-type region 14 is formed to bury the charge accumulation region 13. Since the charge accumulation region 13 is positioned away from the substrate surface, the influence of the substrate surface can be mitigated. The p-type regions 12 and 14 and the n-type region 13 constitute a photodiode and increase the pn junction area.

An n-type vertical transfer path 17 of VCCD is formed facing the n-type charge accumulation region 13, with a partial region of the p-type well 12 being interposed therebetween. The depth of the vertical transfer path 17 is shallower than the depth of the charge accumulation region 13. A p-type channel stopper region 18 is formed between adjacent columns to electrically separate each column.

An insulating film 20a of silicon oxide or the like is formed on the surface of the vertical transfer path 17, and a vertical transfer electrode 19 is formed on the insulating film 20a. The vertical transfer electrode 19 is usually made of two layers of polysilicon. First and second polysilicon electrodes are alternately disposed along the longitudinal direction of VCCD.

Figure 3B:
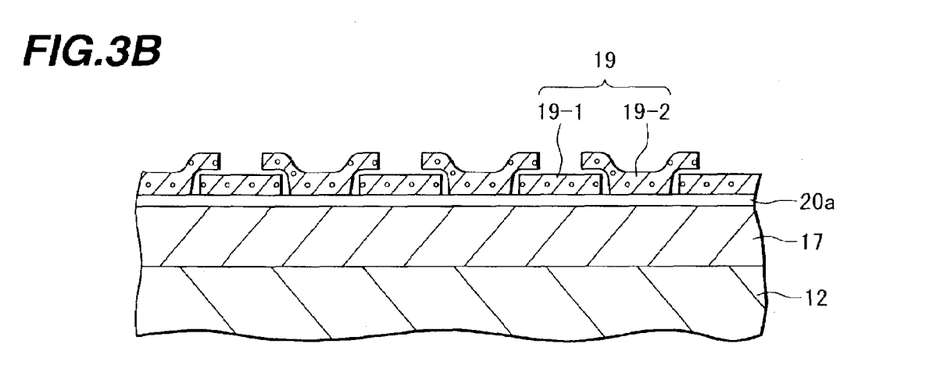

FIG. 3B shows the outline structure of VCCD whose vertical transfer electrodes are made of two layers of polysilicon. On the insulating film 20a of silicon oxide formed on the n-type vertical transfer path 17, first and second polysilicon electrodes 19-1 and 19-2 are alternately disposed.

In manufacturing the vertical transfer electrodes 19, a polysilicon layer is first deposited and patterned by using a photoresist pattern as an etching mask, and the resist pattern is removed to form first polysilicon electrodes 19-1. There is a possibility that the insulating film 20a, in the area where the polysilicon electrode is not left, is damaged or its surface is made rough.

The surface of the first polysilicon electrode 19-1 is oxidized to form an insulating film to be interposed between the first and second polysilicon electrodes 19-1 and 19-2. When the surface of the first polysilicon electrode is oxidized, the oxide film, in the area where the first polysilicon electrode is not left, grows slightly and oxidation progresses under the bottom peripheral area of the first polysilicon electrode 19-1. It is not easy to uniformly control the oxide film under the bottom peripheral area of the first polysilicon electrode 19-1. If the insulating film 20a is made of a lamination film (NO film) of an oxide film and a nitride film or a lamination film (ONO film) of an oxide film, a nitride film and an oxide film, oxidation of the substrate surface can be suppressed although oxidation under the bottom peripheral area of the polysilicon electrode cannot be prevented.

After the first polysilicon electrode 19-1 is oxidized and its surface is covered with an oxide film, the second polysilicon electrodes 19-2 are formed by a method similar to that of forming the first polysilicon electrodes 19-1. The first and second polysilicon electrodes 19-1 and 19-2 are electrically insulated by the oxide film. It is not easy to make uniform the characteristics of the region between electrodes of two layers of polysilicon.

If there is a variation or the like of the thicknesses of the insulating film in the area where the first and second polysilicon electrodes 19-1 and 19-2 face each other, it can be considered that a potential dip or barrier or the like is formed in the transfer path between electrodes when a drive voltage is applied to the electrode. Such potential disturbance may form residual transfer charges during charge transfer.

VCCD transfers charges of pixels of two colors as shown in FIG. 2. If there are residual transfer charges of one color, these charges change to a signal of the other color. If there are residual transfer charges when a red image is photographed, the residual transfer charges are read as a green signal. If there is a potential dip or barrier, the charge transfer in VCCD downstream of the dip or barrier is affected. It can be considered that a red signal reduces its signal amount and changes to black, whereas a green signal increases the signal amount more than the nearby pixels and changes to a white line. The high illuminance vertical lines shown in FIG. 1 may be ascribed to such residual transfer charges in VCCD.

Figure 3C:
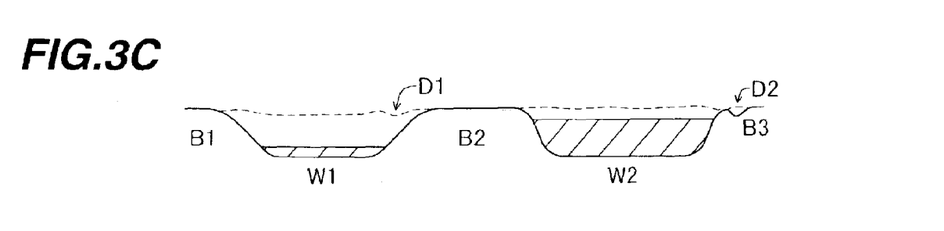

FIG. 3C is a potential profile assuming that there is a potential dip between electrodes. It is assumed that a relatively high voltage (e.g., 0 V) and a relatively low voltage (e.g., −8 V) are applied to each pair of adjacent two electrodes and that charges are transferred from the right to the left. Wells W1 and W2 are formed under the electrodes applied with the relatively high voltage, and barriers B1, B2 and B3 are formed under the electrodes applied with the relatively low voltage. It is assumed that a potential dip D1 is formed in the region between the electrodes for the well W1 and barrier B2 and a potential dip D2 is formed in the region between the electrodes for the well W2 and barrier B3.

It is assumed that charges accumulated in the well W1 are small and charges accumulated in the well W2 is large (near a saturated charge amount). When different voltages are applied to the adjacent electrodes, a fringe electric field is generated in the region between the electrodes and in the nearby region so that the potential changes gradually. If the amount of accumulated charges is small, the degree of cancelling out the applied voltage by the charges in the transfer path is small and it is expected that the charges are collected in the central area of the well and that the region without charges extend outside the central area.

As shown by the potential profile of the well region W1, it can be considered that a steep potential gradient is formed by the fringe electric field in the region near the edges of electrodes so that the potential dip D1 is slanted, which vanishes the substantial potential dip. If the amount of accumulated charges is large, it can be considered that the applied voltage is almost cancelled out by charges in the transfer path so that the fringe electric field is weakened and only a gentle potential gradient is formed, which leaves the potential dip D2 without being cancelled out by the fringe electric field. Such consideration is expected to elucidate the reason of high illuminance vertical lines under high illuminance.

Reverting to FIG. 3A, a portion of the vertical transfer electrode 19 extends above the p-type region 12 between the charge accumulation region 13 and vertical transfer path 17, and controls the potential of the p-type region 12 to read charges from the charge accumulation region 13 to the vertical transfer path 17. An insulating layer 20b of silicon oxide or the like is formed on the vertical transfer electrode 19, and a light shielding film 25 of tungsten (W) or the like is formed on the insulating layer 20b. The light shielding film 25 has an opening above the charge accumulation region 13 to irradiate incidence light only to the photodiode.

A planarizing film 26 of polyimide or the like is formed covering the light shielding film 25 to present a planarized surface. On the surface of the planarizing film 26, a color filter layer 27 is formed by forming filers of red R, green G, blue B or the like. On the color filter layer 27, a planarizing film 28 is formed to present a planarized surface. On the planarizing film 28, micro lenses 29 are disposed. For example, the micro lens 29 is formed by exposing and developing a photoresist layer to form a pattern of lens plan shapes and heating and softening the pattern to fluidize the surface of the pattern. The structure of the solid state image pickup device of the embodiment is well-known and can be realized by utilizing well-known techniques.

If there is a disturbance of a potential profile of VCCD, it can be considered that there are residual transfer charges under high illuminance. Under low illuminance, i.e., in the state that the transfer charge amount is small, it can be considered that residual transfer charges are hard to be formed.

Figure 4:
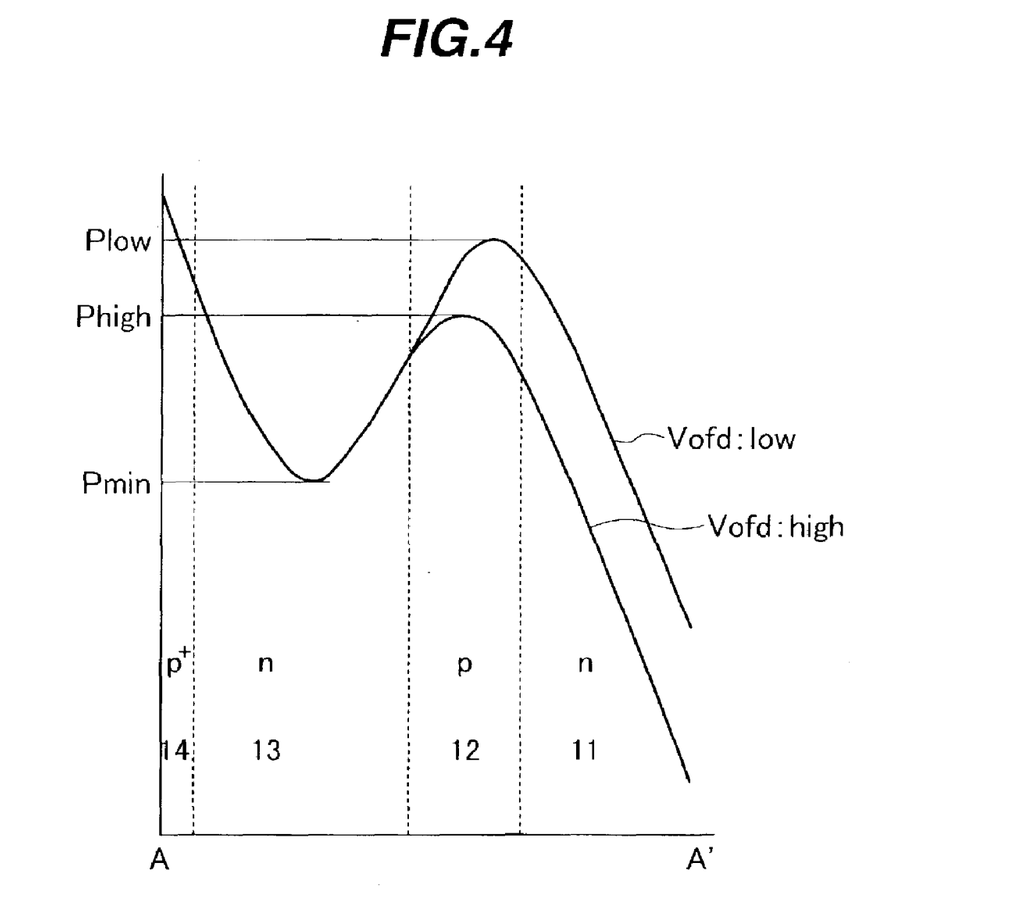
FIG. 4 is a graph showing a potential profile along a depth direction of a photodiode of the solid state image pickup device shown in FIG. 2.

FIG. 4 shows a potential distribution in the photodiode along the substrate depth direction. The abscissa represents a position in the depth direction along line A–A' shown in FIG. 3A and the ordinate represents a potential for an electron. The n-type charge accumulation region 13 forms a potential well with a minimum potential Pmin, whose potential on both sides rises. The p-type well 12 forms a potential barrier relative to electrons accumulated in the n-type accumulation region 13. The potential of the n-type substrate 11 changes with an overflow drain voltage Vofd. As the potential of the n-type substrate 11 is increased, the potential barrier formed by the p-type well 12 changes from Plow, to Phigh.

As the overflow drain voltage is maintained at a low voltage Vofd:low, the potential barrier formed by the p-type well 12 maintains a high barrier Plow. As the overflow drain voltage is increased to a high voltage Vofd:high, the potential of the n-type substrate 11 is lowered and the potential barrier formed by the p-type well 12 is lowered to Phigh correspondingly. As the potential barrier changes, the amount of saturated charge capable of being accumulated in the charge accumulation region 13 changes.

As the overflow drain voltage Vofd is raised further, the potential barrier to be formed by the p-type well 12 disappears so that all charges accumulated in the accumulation region 13 are drained to the substrate 11. Namely, a drainage-through-substrate shutter function is realized.

The present inventor made experiments whether there was any change in the occurrence of high illuminance vertical lines when the saturated charge amount was changed by changing the overflow drain voltage. With sufficiently high illuminance incidence light, saturated charges were accumulated in photodiodes of a tetragonal configuration CCD solid state image pickup device such as shown in FIGS. 2, 3A and 3B. The overflow drain voltage was changed and chip output voltages and vertical lines on the screen were measured.

Figure 5:
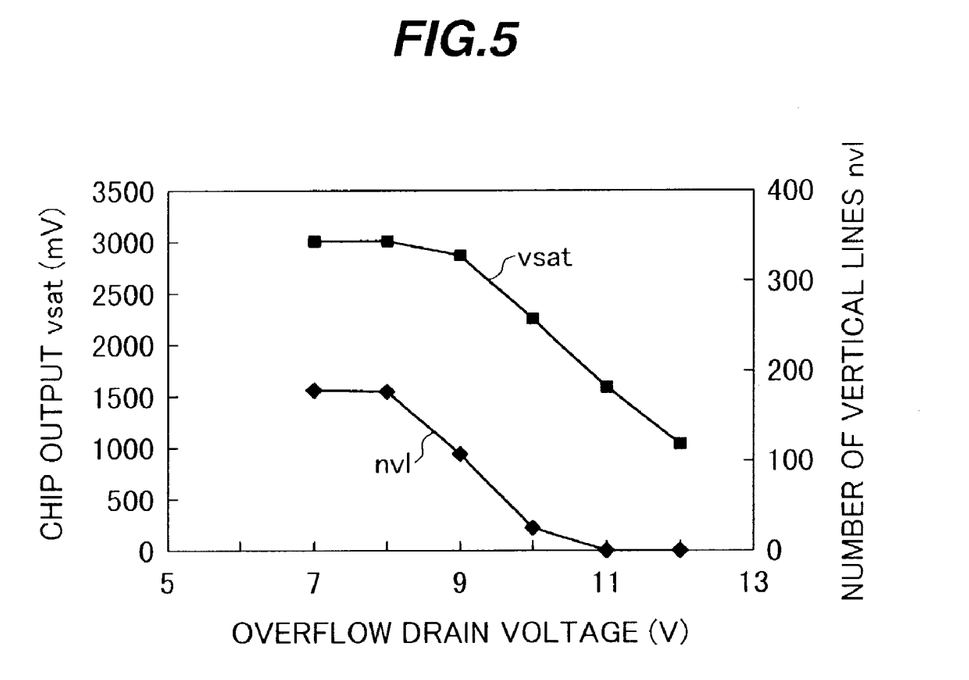
FIG. 5 is a graph showing a change in an amplifier output and the number of vertical lines when an overflow drain voltage is changed.

FIG. 5 is a graph showing the experiment results of how the chip output voltages and the number of vertical lines change with the overflow drain voltage when saturated charges are accumulated in photodiodes. The abscissa represents an overflow drain voltage in the unit of V and the ordinates represent a chip output (mV) and the number of vertical lines.

At the overflow drain voltage of about 8V or lower, the chip output vsat corresponding to the saturated charges was nearly constant at 3000 mV. In the range where the saturated charge amount does not change, the chip output is independent from the overflow drain voltage. As the overflow drain voltage was raised higher than 8 V, the chip output vsat gradually lowered. It can be considered that the saturated charge amount reduced.

The number nvl of vertical lines was approximately constant near at 200 at the overflow drain voltage up to about 8 V. As the overflow drain voltage was raised higher than 8 V, the number of vertical lines was steeply reduced and became almost 0 at the overflow drain voltage of about 11 V.

As the overflow drain voltage is raised, the height of the potential barrier formed by the p-type well 12 lowers as shown in FIG. 4. As the barrier height lowers, the amount of saturated charge capable of being accumulated in the accumulation region reduces.

It can be considered that as the chip output vsat lowers, the saturated charge amount reduces. As the saturated charge amount reduces, the number nvl of vertical lines reduces. In the region where the saturated charge amount begins to reduce, the number of vertical lines reduces greatly although the chip output lowers slightly. The number of vertical lines is expected to be reduced greatly by slightly reducing the saturated charge amount. As the saturated charge amount is reduced by about a half, the number of vertical lines reduces to almost 0. It can be expected that as the saturated charge amount is reduced to about a half or less, the image signals with suppressed vertical lines can be obtained.

As the saturated charge amount is reduced uniformly, the camera dynamic range is narrowed. It is preferable to maintain the dynamic range of incidence light amount broad. If the illuminance of a background object is low, the incidence light amount is low so that it can be expected that the influence is substantially negligible even if the saturated charge amount is reduced.

If the assumption described with reference to FIG. 3C is correct, it can be considered that although a potential dip between electrodes poses a problem if the amount of charge to be transferred is large, the influence of the potential dip can be mitigated considerably if the amount of charge to be transferred is smaller than the saturated charge amount. Apart from the assumption explaining the theory of the phenomenon, the experiment results shown in FIG. 5 indicate that the number of vertical lines can be reduced by reducing the saturated charge amount in the charge accumulation region.

Figure 6:
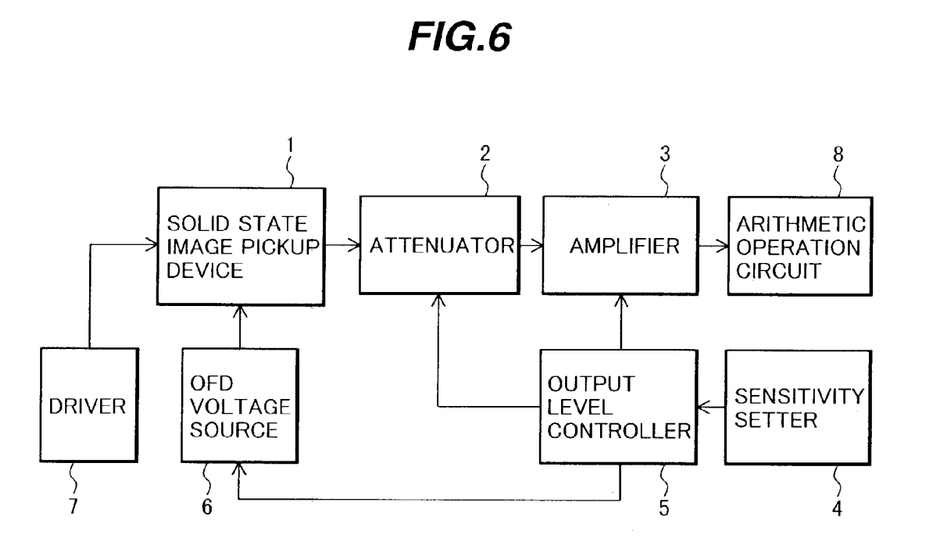
FIG. 6 is a block diagram showing the structure of a solid state image sensing apparatus.

FIG. 6 is a block diagram showing the structure of a digital camera (solid state image sensing apparatus) according to an embodiment of the invention incorporating the above-described preliminary experiment results. A solid image pickup device 1 is a tetragonal configuration solid state image pickup device such as shown in FIGS. 2, 3A and 3B. An output of the solid state image pickup device 1 is supplied to an amplifier 3 via an attenuator 2. At the front end of the amplifier 3, a correlated double sampling circuit is provided. An output of the amplifier 3 is supplied to an arithmetic operation circuit 8 or the like.

A sensitivity setter 4 sets an exposure sensitivity manually, or automatically in accordance with a background illuminance. Preliminary photometry and automatic sensitivity setting will be described illustratively. A sensitivity set by the sensitivity setter 4 is supplied to an output level controller 5. In accordance with the sensitivity, the output level controller 5 controls on/off of the attenuator 2, a gain of the amplifier 3, and the overflow drain voltage to be supplied from an overflow drain voltage source 6 to the solid state image pickup device 1. A driver 7 supplies drive signals for driving the solid state image pickup device.

In accordance with the background illuminance, the sensitivity setter 4 selects and sets one of a lowest sensitivity ISO100 mode, a relatively low sensitivity ISO400 mode, a relatively high sensitivity ISO800 mode, and a highest sensitivity ISO1600 mode.

In the ISO100 mode, the output level controller 5 turns on the attenuator 2 to attenuate an output signal of 3000 mV at the maximum supplied from the solid state image pickup device 1 by ⅓ to supply a voltage signal of 1 V at the maximum to the amplifier 3. The gain of the amplifier 3 is set to "1". The overflow drain voltage source 6 is set to a reference potential (e.g., ground potential) to maintain high the potential barrier formed by the p-type well 12 and output a signal of 3000 mV at the saturated charge amount.

In the ISO400 mode, the output level controller 5 turns off the attenuator 2 to output an input signal as it is. The gain of the amplifier 3 is set to "1". The overflow drain voltage of the overflow drain voltage source 6 is set higher to lower the potential barrier to be formed by the p-type well 12 and set the saturated output to 800 mV which is lower than a half of the saturated charge amount. By setting the saturated output to less than a half of the saturated charge amount, the generation of vertical lines can be almost prevented.

In the ISO800 mode, the output level controller 5 turns off the attenuator 2 to output an input signal as it is. The gain of the amplifier 3 is set to "2". The overflow drain voltage of the overflow drain voltage source 6 is set further higher to set the saturated output to 400 mV. By setting the gain of the amplifier 3 outside the solid state image pickup device to "2", a system output level becomes about a two-fold of that in the ISO400 mode at the same incidence light amount.

In the ISO1600 mode, the output level controller 5 turns off the attenuator 2 to output an input signal as it is. The gain of the amplifier 3 is set to "4". The overflow drain voltage of the overflow drain voltage source 6 is set further higher to set the saturated output to 200 mV. A system output level becomes a two-fold of that in the ISO800 mode at the same incidence light amount.

Figure 7:
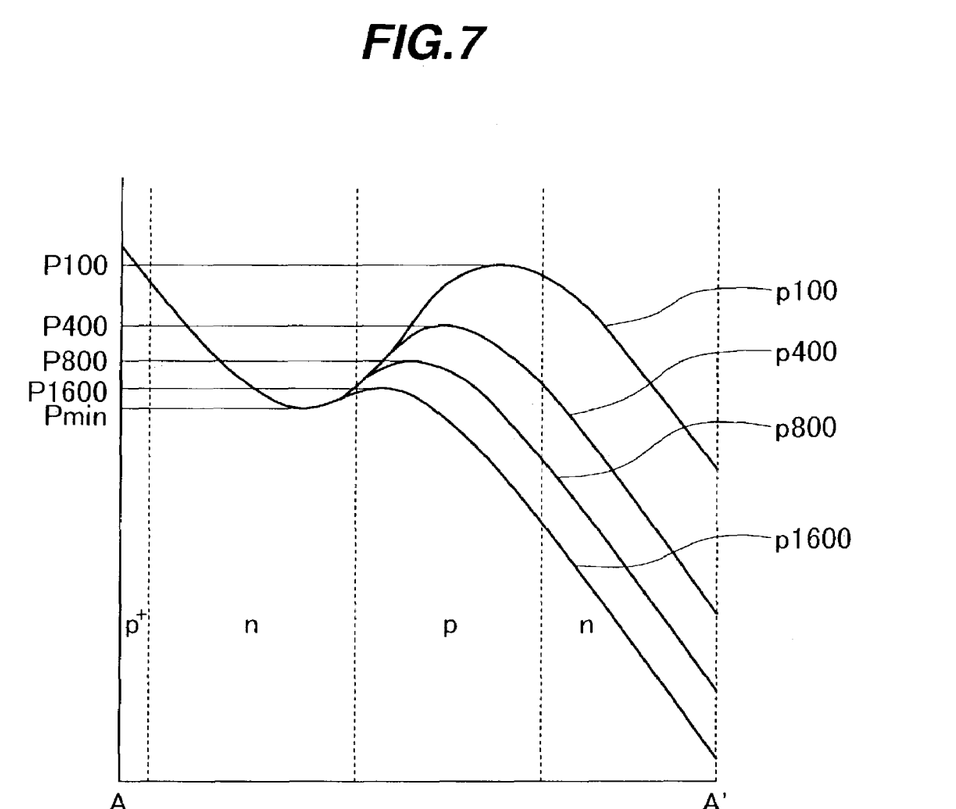
FIG. 7 is a graph showing a potential profile of a photodiode of the solid state image sensing apparatus shown in FIG. 6 when a sensitivity is changed.
Figure 8A:
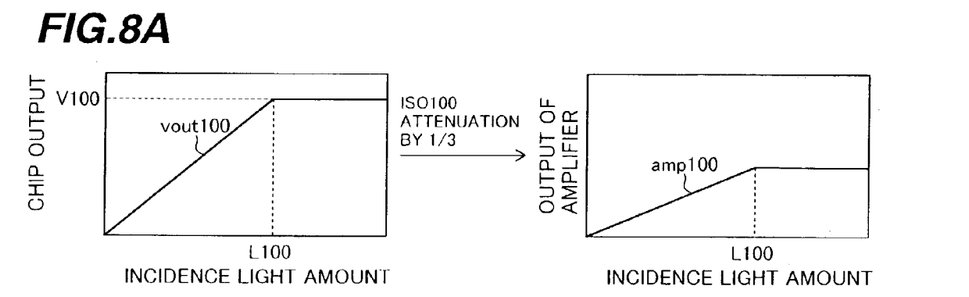
FIGS. 8A to 8D are graphs showing the characteristics of the solid state image pickup device and the relation between an output voltage of an amplifier and an incidence light amount when a sensitivity of the solid state image sensing apparatus shown in FIG. 6 is changed.
Figure 8B:
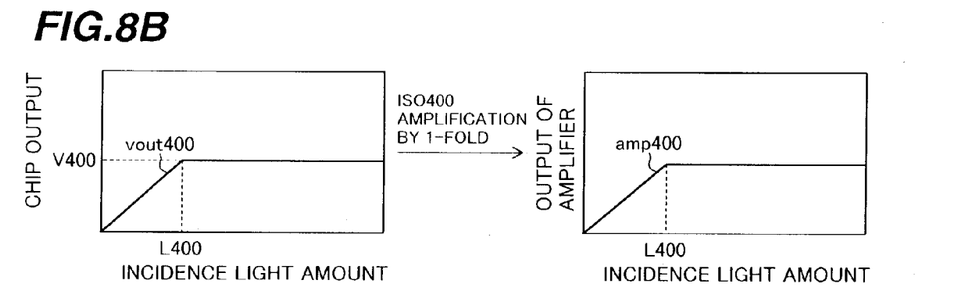
Figure 8C:
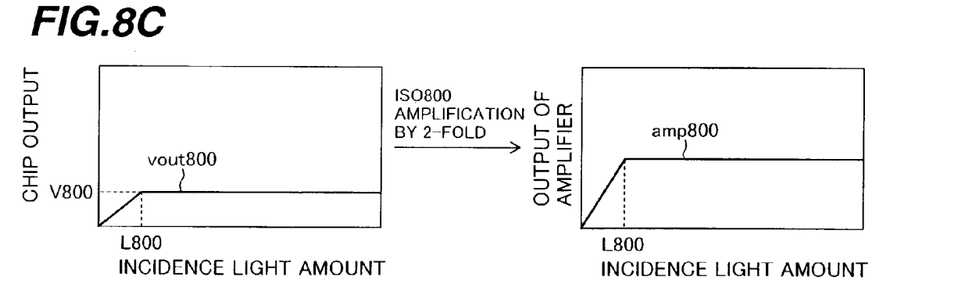
Figure 8D:
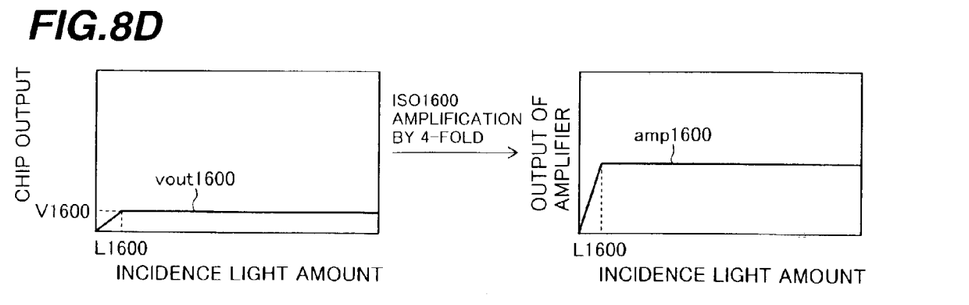

FIG. 7 is a graph conceptually illustrating how a potential distribution in a photodiode along a substrate thickness direction changes with an exposure sensitivity. The abscissa represents a depth from the surface of a silicon substrate and the ordinate represents a potential barrier height. P100 indicates a potential barrier height in the ISO100 mode and p100 indicates a potential profile in the ISO100 mode. Similarly, P400, P800 and P1600 indicate the potential barrier heights in the ISO400, ISO800 and ISO1600 modes, respectively, and p400, p800 and p1600 indicate the potential profiles in the ISO400, ISO800 and ISO1600 modes, respectively. Pmin indicates a potential minimum in the charge accumulation region 13.

FIGS. 8A to 8D show the response characteristics of a solid state image pickup device in each mode and the signal intensity characteristics of a signal after amplification in a digital camera system. The abscissa represents an incidence light amount and the ordinates represent a chip output and an output after amplification.

Chip outputs vout100, vout400, vout800 and vout1600 show the output characteristics in the ISO100, ISO400, ISO800 and ISO1600 modes, respectively. Outputs after amplification, amp100, amp400, amp800 and amp1600 show the output characteristics of outputs amplified by the amplifier 3 in the ISO100, ISO400, ISO800 and ISO1600 modes, respectively.

Incidence light amounts L100, L400, L800 and L1600 show the amounts at which the chip outputs saturate, in the ISO100, ISO400, ISO800 and ISO1600 modes, respectively. V100, V400, V800 and V1600 show the corresponding chip outputs.

At the middle and high sensitivities of the ISO400 and higher, the background illuminance is middle or lower and the amount of charge accumulated in a photodiode is middle or smaller. Therefore, even if the saturated charge amount is reduced, there is only a small possibility that image charges overflow from the photodiode.

If the saturated charge amount of a photodiode is reduced, VCCD can transfer signal charges with sufficient room for charge transfer because the maximum charge transfer amount of VCCD does not change. As shown in FIG. 5, if the saturated output is lowered to a half or less, the number of vertical lines can be reduced approximately to 0. Therefore, with the setting of a middle or higher sensitivity, the generation of vertical lines can be reduced considerably.

In the ISO100 mode, a background illuminance is high so that there is a possibility that charges near the saturated charge amount are accumulated in a photodiode. As the charges near the saturated charge amount are accumulated, VCCD transfer charges like in the transfer limit state so that there is a possibility of residual transfer charges. However, the output of the solid state image pickup device 1 has less influence of residual transfer charges because the output is attenuated by the attenuator by ⅓. Since the amplifier 3 outputs a signal at a low gain, circuit noises are reduced and even if there are residual transfer charges, they are less displayed on a screen.

Automatic sensitivity setting has been described illustratively. Manual sensitivity setting can be performed in a manner similar to the automatic sensitivity setting because of the same fundamentals that the sensitivity is lowered if the background illuminance is high whereas it is raised if the background illuminance is low.

Although a digital camera using a tetragonal configuration CCD solid state image pickup device has been described above, the solid state image pickup device is not limited only thereto. Various types of solid state image pickup devices can be used as the solid state image pickup device 1 of the digital camera shown in FIG. 6.

Figure 9:
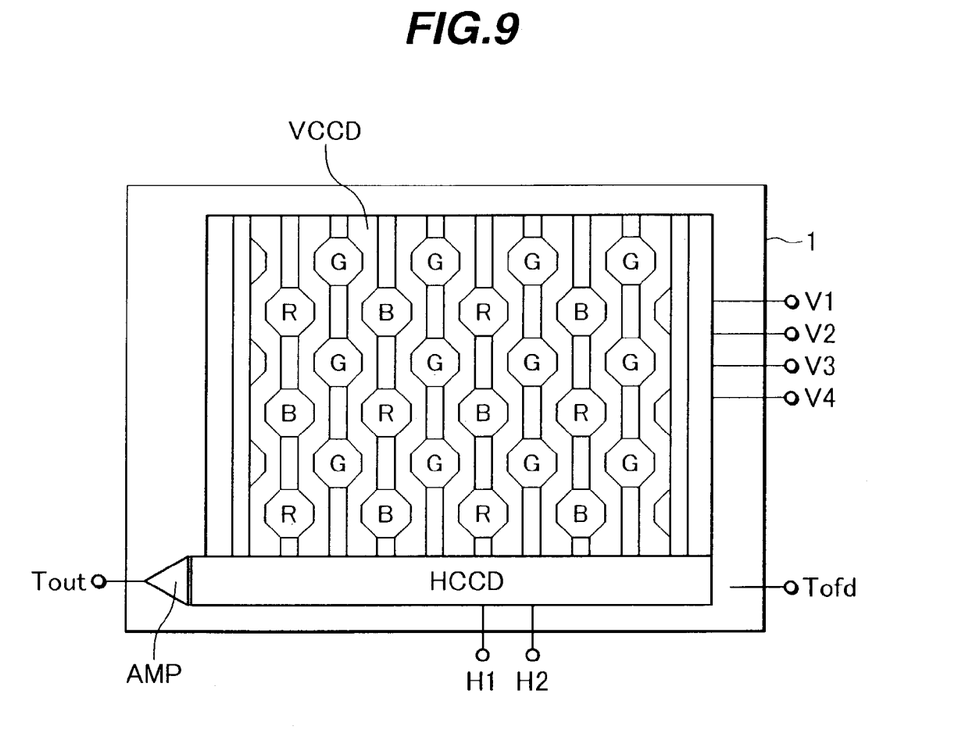
FIG. 9 is a schematic plan view of a honeycomb configuration CCD solid state image pickup device.

FIG. 9 shows the plan layout of a honeycomb configuration CCD solid state image pickup device. Pixels R, G and B are disposed in a honeycomb configuration. Namely, green pixels G are disposed in a first tetragonal matrix, and red pixels R and blue pixels B are disposed in a second tetragonal matrix at interstitial positions of the first tetragonal matrix. VCCDs extend along the vertical direction between pixel columns in a zigzag fashion. Other structures are similar to those shown in FIG. 2. A CCD solid state image pickup device can be provided which has well-balanced constituent elements similar to the previously described embodiment and can suppress vertical lines.

Figure 10:
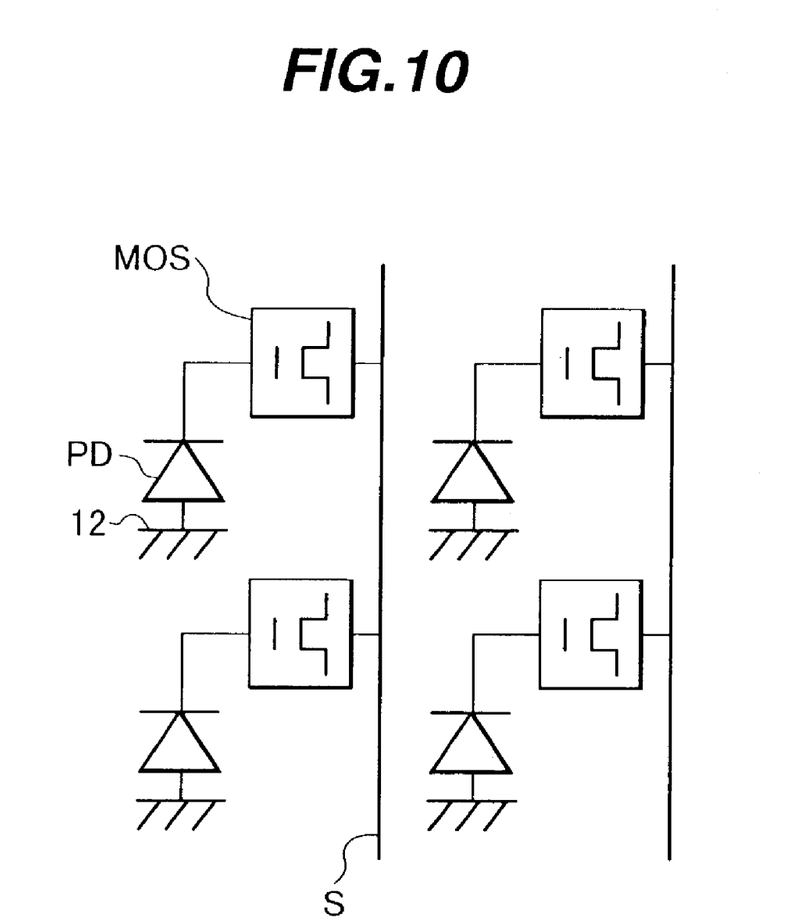
FIG. 10 is an equivalent circuit diagram of a MOS solid state image pickup device.

FIG. 10 is an equivalent circuit of a MOS solid state image pickup device. Charge accumulated in a photodiode PD is detected with a MOS-type charge detector MOS and an output signal of the detector is supplied to an output signal line S. The anode electrode 12 of the photodiode is made of a p-type well such as shown in FIG. 3A. The saturated charge amount of the photodiode changes with an overflow drain voltage. Although VCCD does not exist, a function of changing the saturated charge amount in accordance with a sensitivity can be realized similar to the digital camera shown in FIG. 6. A solid state image pickup device can be provided which has well-balanced constituent elements.

The present invention has been described in connection with the preferred embodiments. The invention is not limited only to the above embodiments. It is apparent to those skilled in the art that various modifications, improvements, combinations, and the like can be made.

I claim:

1. A solid state image sensing apparatus comprising:
a solid state image pickup device comprising:
a semiconductor substrate of a first conductivity type;
a well formed in said semiconductor substrate, the well having a second conductivity type opposite to the first conductivity type;
a number of charge accumulation regions formed in the well, the charge accumulation region having the first conductivity type and a photodiode being constituted of the charge accumulation region and the well; and
an overflow drain terminal electrically connected to the semiconductor substrate and used for controlling a potential barrier to be formed by the well by applying a bias voltage to the semiconductor substrate;
an amplifier for amplifying an output from said solid state image pickup device;
a sensitivity setter for setting a photographic sensitivity in a still mode, from among a plurality of sensitivities; and
an output level controller for changing an amount of charge capable of being accumulated in the charge accumulation region in the still mode by changing the bias voltage to be applied to the overflow drain terminal in the still mode in accordance with a set sensitivity.

2. The solid state image sensing apparatus according to claim 1, further comprising an attenuator connected between said solid state image pickup device and said amplifier, wherein said output level controller receives the photographic sensitivity set by the sensitivity setter and controls said attenuator and a gain of said amplifier in accordance with the set photographic sensitivity, such that, when the set photographic sensitivity is low, said output level controller controls said attenuator to attenuate an output of said solid state image pickup device.

3. The solid state image sensing apparatus according to claim 2, wherein when the photographic sensitivity is high, said output level controller turns off said attenuator and sets the gain of said amplifier to larger than 1.

4. The solid state image sensing apparatus according to claim 2, wherein when the sensitivity is between low and high, said output level controller turns off said attenuator and sets the gain of said amplifier to 1.

5. The solid state image sensing apparatus according to claim 3, wherein when the sensitivity is between low and high, said output level controller turns off said attenuator and sets the gain of said amplifier to 1.

6. The solid state image sensing apparatus according to claim 1, wherein the charge accumulation regions are disposed in a matrix configuration having a plurality of rows and columns, and said solid state image pickup device further comprises a vertical charge transfer path formed in the well adjacent to each column of the charge accumulation regions and a horizontal charge transfer path and coupled to one end of the vertical charge transfer paths.

7. The solid state image sensing apparatus according to claim 4, wherein the charge accumulation regions are disposed in a matrix configuration having a plurality of rows and columns, and said solid state image pickup device further comprises a vertical charge transfer path formed in the well adjacent to each column of the charge accumulation regions and a horizontal charge transfer path and coupled to one end of the vertical charge transfer paths.

8. The solid state image sensing apparatus according to claim 5, wherein the charge accumulation regions are disposed in a matrix configuration having a plurality of rows and columns, and said solid state image pickup device further comprises a vertical charge transfer path formed in the well adjacent to each column of the charge accumulation regions and a horizontal charge transfer path and coupled to one end of the vertical charge transfer paths.

9. The solid state image sensing apparatus according to claim 6, wherein the matrix of the charge accumulation regions includes a first tetragonal matrix and a second tetragonal matrix disposed at interstitial positions of the first tetragonal matrix.

10. The solid state image sensing apparatus according to claim 7, wherein the matrix of the charge accumulation regions includes a first tetragonal matrix and a second tetragonal matrix disposed at interstitial positions of the first tetragonal matrix.

11. The solid state image sensing apparatus according to claim 8, wherein the matrix of the charge accumulation regions includes a first tetragonal matrix and a second tetragonal matrix disposed at interstitial positions of the first tetragonal matrix.

12. The solid state image sensing apparatus according to claim 1, wherein said solid state image pickup device further comprises a MOS charge detector coupled to each of the charge accumulation regions.

13. The solid state image sensing apparatus according to claim 4, wherein said solid state image pickup device further comprises a MOS charge detector coupled to each of the charge accumulation regions.

14. The solid state image sensing apparatus according to claim 5, wherein said solid state image pickup device further comprises a MOS charge detector coupled to each of the charge accumulation regions.

15. The solid state image sensing apparatus according to claim 1, wherein said sensitivity sensor is capable of automatically setting the photographic sensitivity in accordance with a background illumination.

* * * * *